(12) United States Patent
Hu (10) Patent No.: US 10,090,270 B2
(45) Date of Patent: Oct. 2, 2018

(54) METAL PILLAR WITH CUSHIONED TIP (71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/461,925

(22) Filed: Mar. 17, 2017

(65) Prior Publication Data

US 2017/0278815 A1  Sep. 28, 2017

Related U.S. Application Data

(60) Provisional application No. 62/313,226, filed on Mar. 25, 2016.

(51) Int. Cl.
*H01L 23/00* (2006.01)

(52) U.S. Cl.
CPC .............. *H01L 24/13* (2013.01); *H01L 24/14* (2013.01); *H01L 24/16* (2013.01); *H01L 2224/13564* (2013.01); *H01L 2224/13582* (2013.01); *H01L 2224/13644* (2013.01); *H01L 2224/13647* (2013.01); *H01L 2224/13655* (2013.01); *H01L 2224/1403* (2013.01); *H01L 2224/16147* (2013.01); *H01L 2224/16148* (2013.01)

(58) Field of Classification Search
None
See application file for complete search history.

(56) References Cited

U.S. PATENT DOCUMENTS

| 9,099,364 | B1* | 8/2015 | Hsu | ......................... H01L 24/14 |
| 2005/0026413 | A1* | 2/2005 | Lee | ......................... H01L 24/11 438/612 |
| 2012/0129333 | A1* | 5/2012 | Yim | ......................... H01L 24/11 438/613 |
| 2015/0091178 | A1* | 4/2015 | Reber | ................... H01L 23/481 257/774 |
| 2015/0262950 | A1* | 9/2015 | Cate | ......................... H01L 21/00 257/737 |
| 2016/0192496 | A1* | 6/2016 | Wang | ..................... H05K 1/111 361/767 |

\* cited by examiner

*Primary Examiner* — Michelle Mandala
(74) *Attorney, Agent, or Firm* — JCIPRNET (57) ABSTRACT

A metal pillar with cushioned tip is disclosed. The cushioned tip offsets height difference among metal pillars. So that the height difference among metal pillars gives no significant effect to electrical coupling. The cushioned tip is a metal sponge. Additional one embodiment shows a second metal is plated on a tip of the metal sponge. A hardness of the second metal is greater than a hardness of a metal of the metal sponge, so that the second metal can stab into a corresponding metal sponge for electrical coupling.

9 Claims, 7 Drawing Sheets

METAL PILLAR WITH CUSHIONED TIP

RELATED APPLICATIONS

The present application claims the benefit of U.S. Provisional Application No. 62/313,226, filed Mar. 25, 2016, the disclosure of which is hereby incorporated by reference herein in its entirety.

BACKGROUND

Technical Field

The present invention relates to a metal pillar, especially relates to a metal pillar with a cushioned tip which absorbs height differences among metal pillars.

Description of Related Art

Figure 1A:
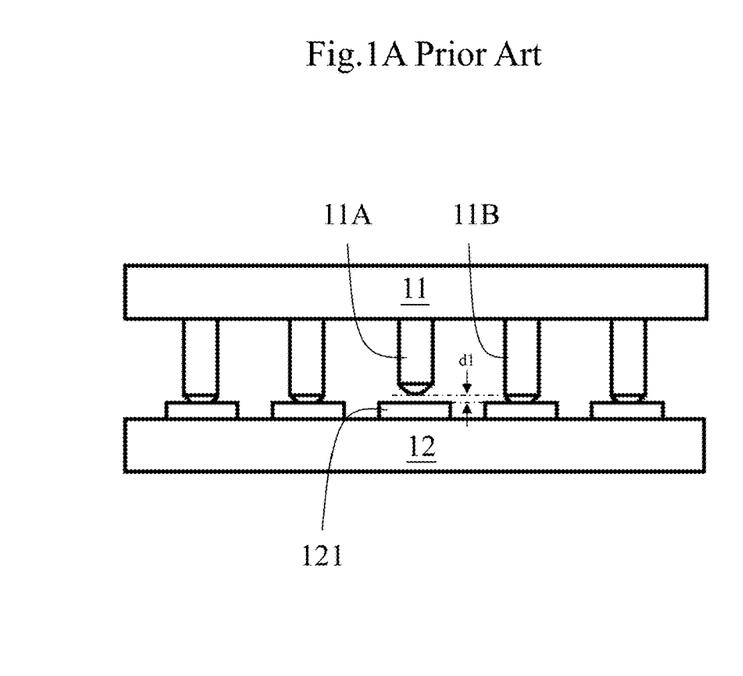
FIGS. 1A~1B show a prior art.
Figure 1B:
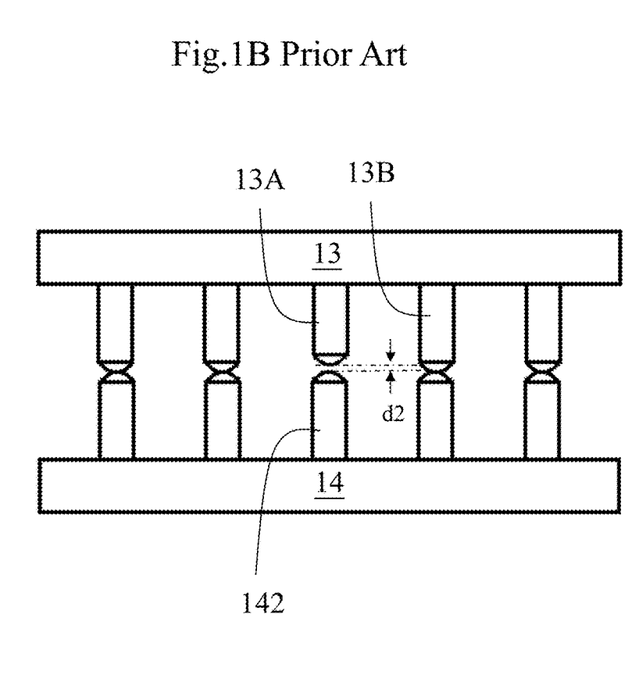

FIGS. 1A~1B Show a Prior Art.

FIG. 1A shows that a plurality of metal pillars 11A, 11B configured on a bottom side of a first device 11 and a plurality of metal pads 121 configured on a top side of a second electronic device 12. Each of the metal pillars 11A, 11B is configured to electrically couple to a corresponding one metal pad 121. However, height differences among metal pillars exist due to intrinsic process variation. For example, a height difference d1 occurs between metal pillar 11A and metal pillar 11B. The problem for the prior art is that the height differences d1 cause electrical connection problem. The shorter one metal pillar 11A may not contact the metal pad 121.

FIG. 1B shows similar problem occurs in metal pillars coupled to metal pillars. FIG. 1B shows that a plurality of first metal pillars 13A, 13B configured on a bottom surface of a third device 13 and a plurality of second metal pillars 142 configured on a top surface of a fourth device 14. Each of the third metal pillars 13A, 13B is electrically coupled to a corresponding one of the second metal pillars 142. However, height differences among metal pillars exist due to intrinsic process variation. For example, a height difference d2 occurs between metal pillar 13A and metal pillar 13B. The problem for the prior art is that the height differences d2 cause electrical connection problem. The shorter one metal pillar 13A may not contact the corresponding metal pillar 142.

A solution needs to be conceived to solve this problem, especially when the requirement for package technology is higher and higher for the swiftly developed semiconductor industry.

DETAILED DESCRIPTION OF THE INVENTION

A metal pillar with cushioned tip is disclosed. The cushioned tip offsets height difference among metal pillars. So that the height difference among metal pillars gives no significant effect to electrical coupling.

Figure 2A:
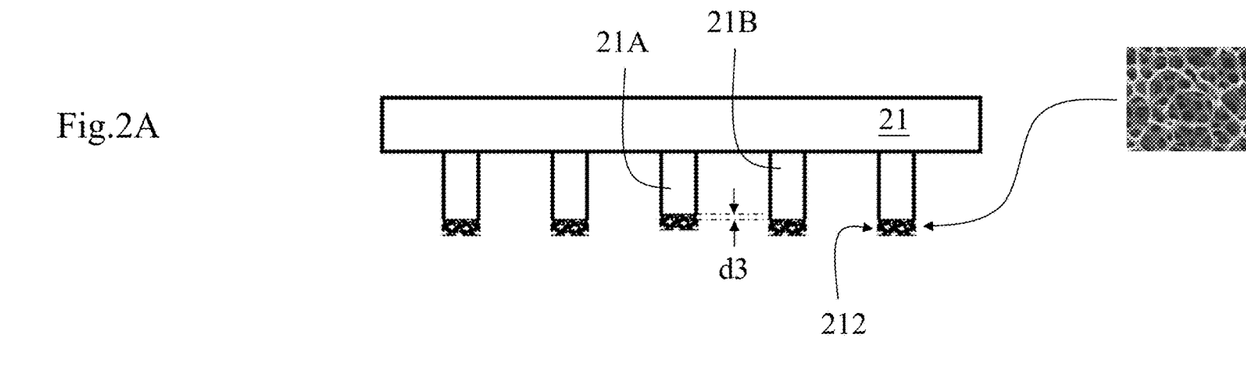
FIGS. 2A~2B shows a first embodiment according to the present invention.
Figure 2B:
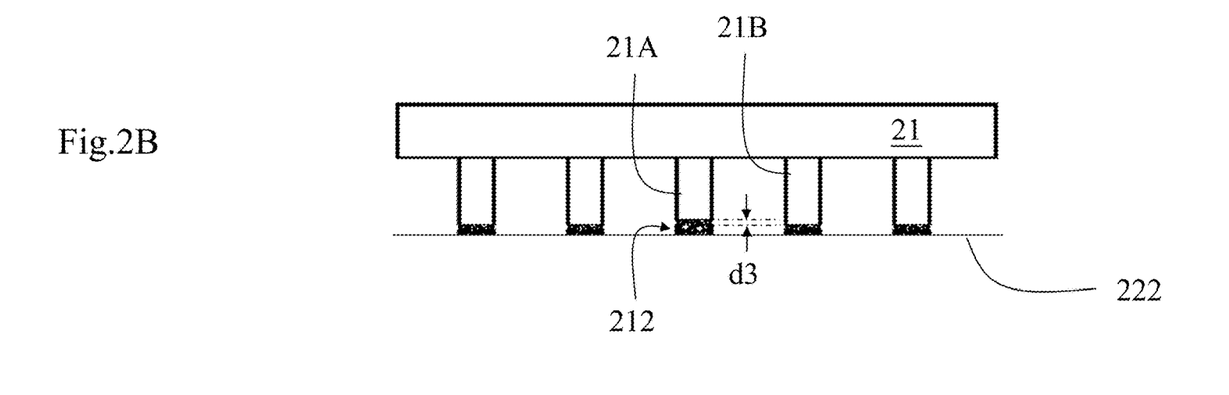

FIGS. 2A~2B Shows a First Embodiment According to the Present Invention.

FIG. 2A shows a plurality of metal pillars 21A, 21B configured on a bottom side of an electronic device 21. There is a height difference d3 exists between metal pillar 21A and metal pillar 21B. To cope with the difference problem, a plurality of metal sponges 212 are formed, each metal sponge 212 is configured on a tip of a corresponding metal pillar 21A, 21B to form a plurality of metal pillars with cushioned tips 212. The metal sponge 212 is conductive and compressible so that difference d3 between metal pillars can be offset by the compressibility of the metal sponges 212 during coupling.

FIG. 2B shows a plurality of metal pillars 211 with a metal sponge 212 on tip. The rationale for the present invention can be evidenced by FIG. 2B. FIG. 2B shows the height difference among metal pillars 211 can be leveled out by contacting the metal sponge 212 with a flat surface 222, and hence the difference d3 give no significant influence in electrical coupling there between.

Figure 3A:
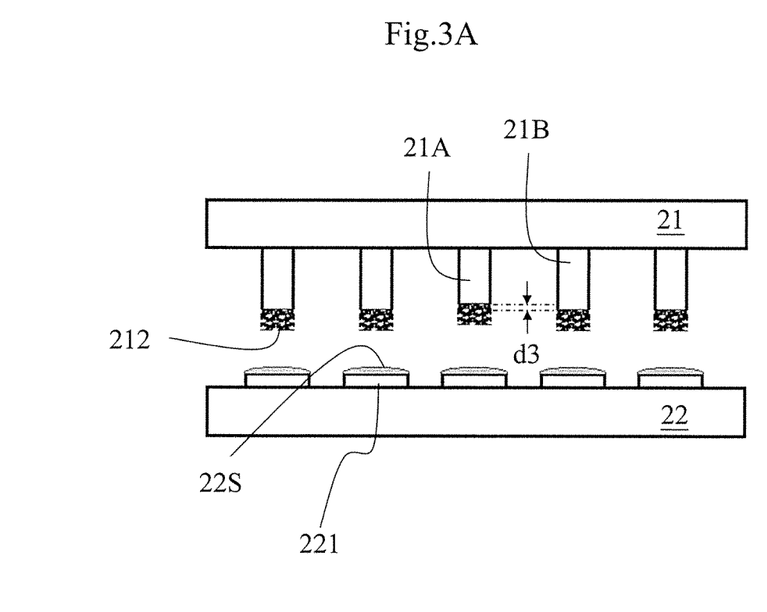
FIGS. 3A~3B shows a first coupling embodiment according to the present invention.
Figure 3B:
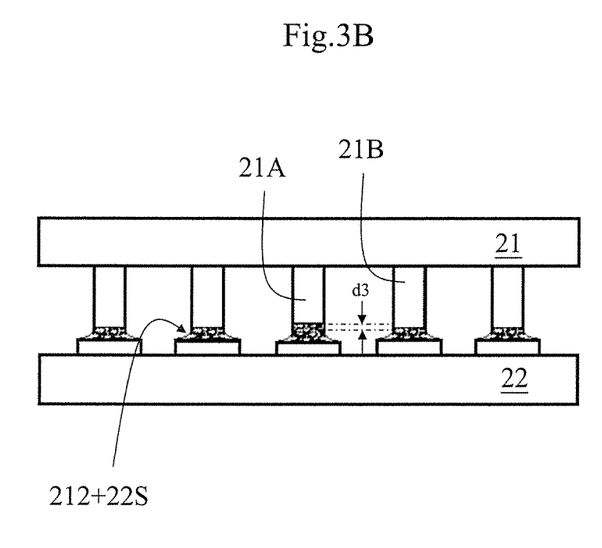

FIGS. 3A~3B Shows a First Coupling Embodiment According to the Present Invention.

FIG. 3A shows an electronic device 21, like the one shown in FIG. 2A, which has a plurality of metal pillars 21A, 21B with metal sponge 212 on tip is prepared, with height difference d3 between metal pillar 21A and metal pillar 21B, and ready to electrically couple to a second electronic device.

A plurality of metal pads 221 are configured on a top surface of the second electronic device 22; a solder layer 22S is configured on a top surface of each metal pad 221.

FIG. 3B shows that the solder 22S is melted and absorbed into the metal sponges 212 while the plurality of metal pillars 21A, 21B are electrically coupled to the metal pads. Each metal sponge 212 absorbs solder 22S into sponge slits to form good electrical coupling. The height difference d3 between metal pillars give no significant influence to the electrical coupling due to leveling effect of the metal sponges 212.

Figure 4A:
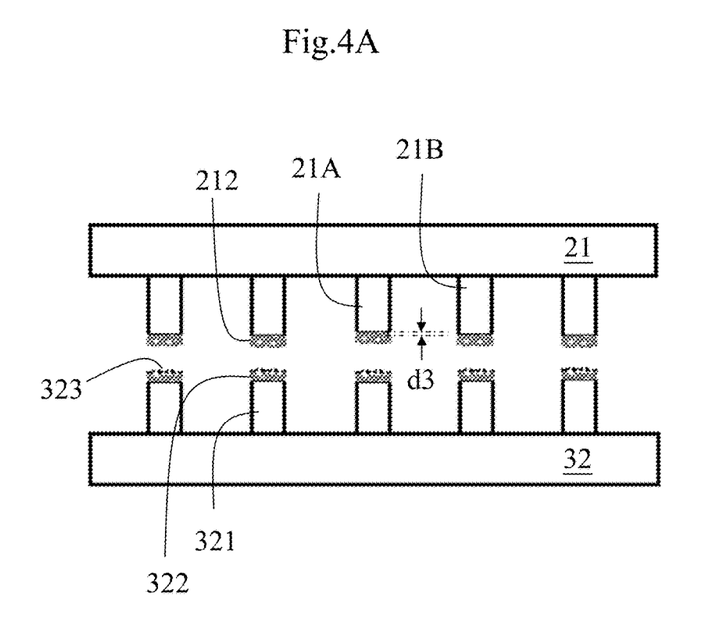
FIGS. 4A~4B shows a second embodiment according to the present invention.
Figure 4B:
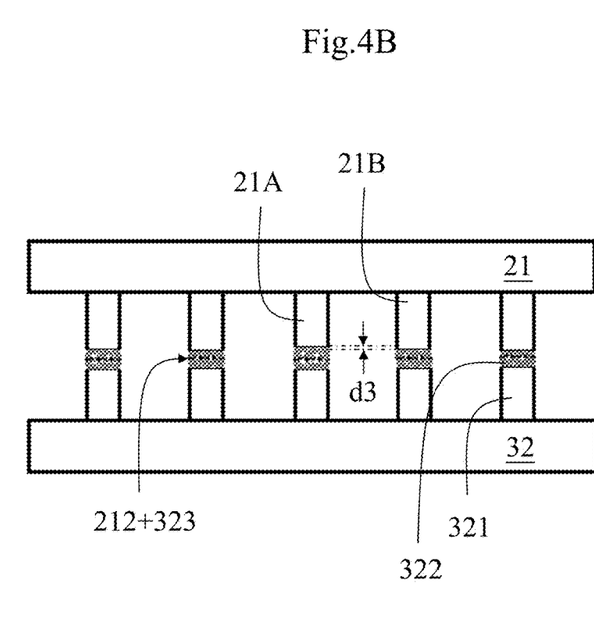

FIGS. 4A~4B Shows a Second Embodiment According to the Present Invention.

FIG. 4A shows a first device 21, like the one shown in FIG. 2A, is prepared and ready to electrically couple to a second electronic device 32.

FIG. 4A shows that the second electronic device 32 is prepared. A plurality of metal pillars 321 are configured on a top surface of the second electronic device 32. A plurality of metal sponges 322 are prepared, each metal sponge 322 is configured on a tip of a corresponding metal pillars 321. A second metal 323 is plated on a tip of the metal sponge 322; wherein the second metal 323 has a hardness greater than a hardness of a first metal of the metal sponge 322. For example, the first metal is copper for the metal sponge 322 and the second metal is nickel (Ni), a third metal such as Gold can be plated over nickel to form Cu/Ni/Au layer for the tip of the metal sponge 322.

FIG. 4B shows an electrical coupling status for FIG. 4A. During electrical coupling between the plurality of top metal pillars 21A, 21B and the bottom metal pillars 321, the greater hardness of the second metal 323 stabs into the metal sponge 212 to give a good electrical coupling there between.

Figure 5A:
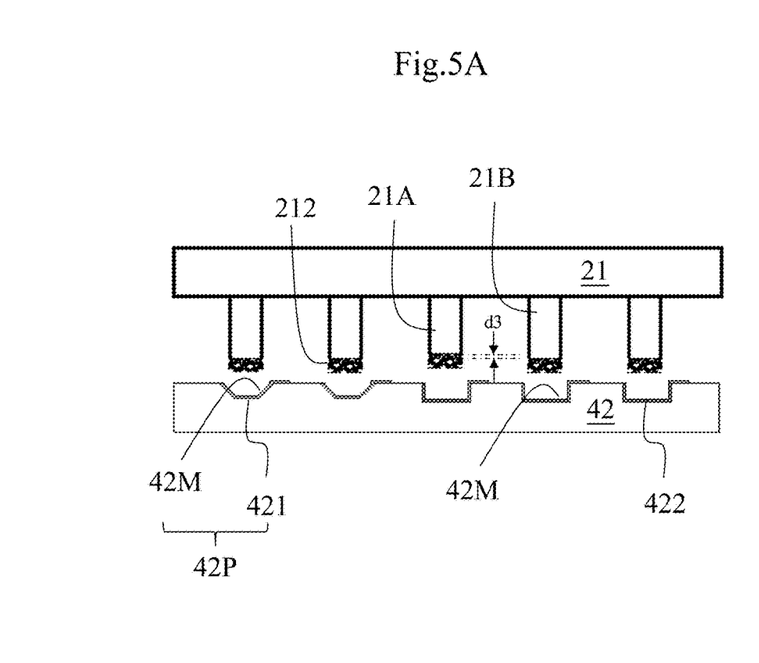
FIGS. 5A~5B shows a third embodiment according to the present invention.
Figure 5B:
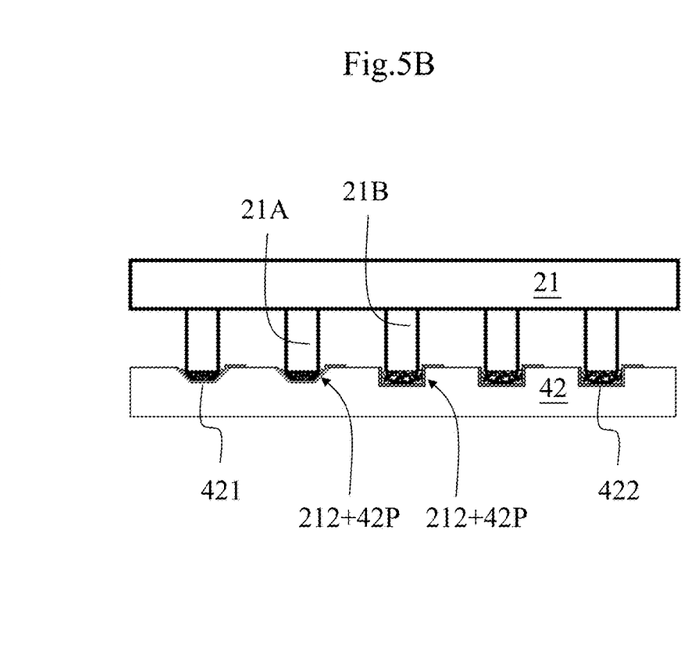

FIGS. 5A~5B Shows a Third Embodiment According to the Present Invention.

FIG. 5A shows a first device 21, like the one shown in FIG. 2A, is prepared and ready to electrically couple to a second electronic device 42.

A plurality of cavity pads 42P is prepared, each of the cavity pad 42P is composed of a base metal 42M configured on a top surface of a corresponding cavity 421. The base metal 42M can be Copper plated by Nickel and then plated by Gold (Cu/Ni/Au) as an example. The plurality of cavity pads 42P are configured on a top surface of a second electronic device 42; each of the cavity pads 42P is adaptive for a metal pillars 2A, 21B with metal sponge 212 on tip of a corresponding metal pillar 21A, 21B to insert, electrical coupling is obtained due to tight contact between the metal pillar 21A, 21B, metal sponge 212, and the cavity pad 42P.

A shape for the cavity pad, in a section view, can be one of polygon cavity 421 and rectangular cavity 422 as show in FIG. 5A.

FIG. 5B shows an electrical coupling status for FIG. 5A. During electrical coupling between the plurality of top metal pillars 21A, 21B and the cavity pads 42P, a god electrical coupling is obtained due to tight contact in the cavity among the metal pillar 21A, 21B, metal sponge 212, and the cavity pad 42P.

Figure 6A:
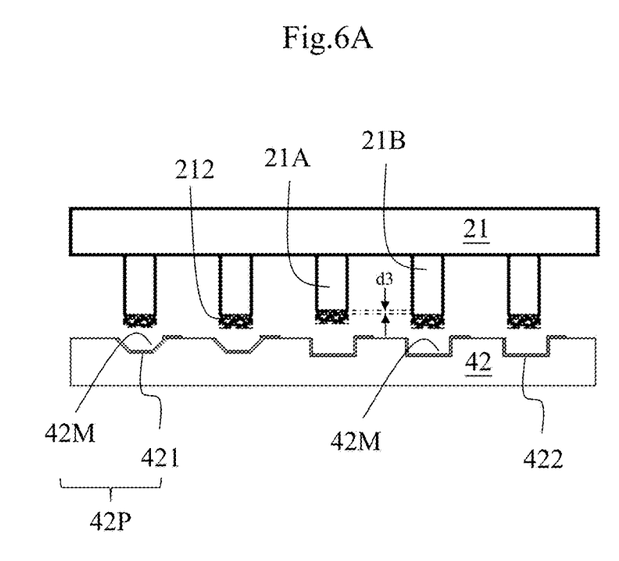
FIGS. 6A~6B shows a fourth embodiment according to the present invention.
Figure 6B:
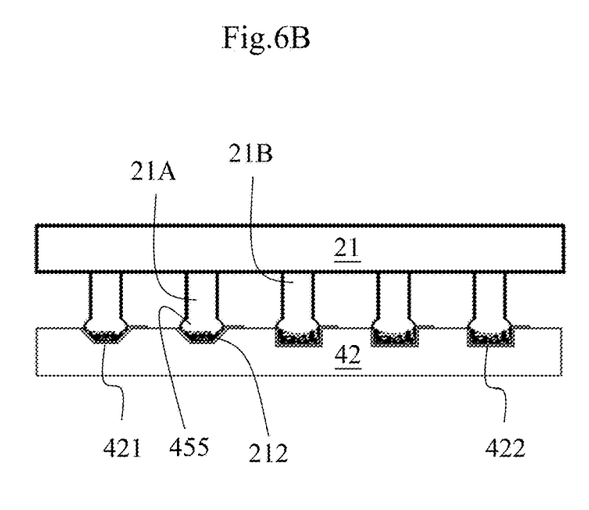

FIGS. 6A~6B Shows a Fourth Embodiment According to the Present Invention.

FIG. 6A is the same as FIG. 5A.

FIG. 6B is similar to FIG. 5B, however, a bigger pressure is applied when processing the electrical coupling, a tip of metal pillar 212 is deformed due to pressure to form a metal bump 455, the metal bump 455 is in tight contact with a corresponding cavity pad 42P.

Figure 7A:
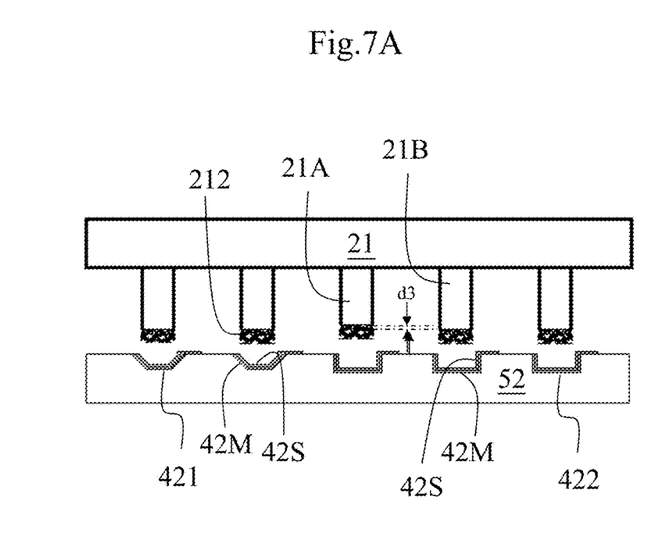
FIGS. 7A~7B shows a fifth embodiment according to the present invention.
Figure 7B:
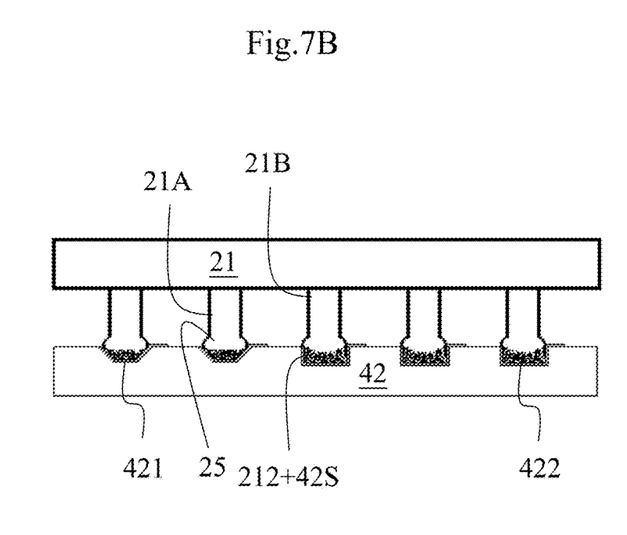

FIGS. 7A~7B Shows a Fifth Embodiment According to the Present Invention.

FIG. 7A shows solder 42S is configured on a top surface of the base metal 42M of a corresponding cavity pad 42P.

FIG. 7B is similar to FIG. 6B, an even better electrical coupling is obtained due to the melted solder 42S absorbed in the metal sponge 212.

While several embodiments have been described by way of example, it will be apparent to those skilled in the art that various modifications may be configured without departs from the spirit of the present invention. Such modifications are all within the scope of the present invention, as defined by the appended claims.

| Numerical system |
| --- |
| electronic device 21 |
| metal pillars 21A, 21B |
| metal pillars 211 |
| height difference d3 |
| metal sponges 212 |
| metal pads 221 |
| flat surface 222 |
| solder 22S |
| metal pillars 321 |
| electronic device 32 |
| metal sponge 322 |
| second metal 323 |
| electronic device 42 |
| solder 42S |
| cavity pads 42P |
| base metal 42M |
| cavity 421 |
| cavity 422 |
| metal bump 455 |

What is claimed is:

1. Metal pillars with cushioned tips, comprising:
   a first metal pillar, configured on a bottom surface of a first device;
   a second metal pillar, configured on a bottom surface of the first device;
   a height difference between the first metal pillar and the second metal pillar;
   a first metal sponge, configured on a tip of the first metal pillar; and
   a second metal sponge, configured on a tip of the second metal pillar.

2. Metal pillars with cushioned tips as claimed in claim 1, further comprises:
   a first metal pad and a second metal pad, configured on a top surface of a second electronic device;
   a first solder layer, configured on a top surface of the first metal pad; and
   a second solder layer, configured on a top surface of the second metal pad;
   the solder melted and absorbed into the sponges while the plurality of metal pillars electrically coupled to the metal pads.

3. Metal pillars with cushioned tips as claimed in claim 1, further comprises:
   a third metal pillar, configured on a top surface of a second electronic device;
   a fourth metal pillar, configured on a top surface of the second electronic device;
   a third metal sponge, configured on a tip of the third metal pillar;
   a fourth metal sponge, configured on a tip of the fourth metal pillar; and
   a plurality of second metals, each plated on a tip of a corresponding metal sponge among the third metal sponge and the fourth metal sponge; wherein the plurality of second metals has a hardness greater than a hardness of a first metal of the metal sponge.

4. Metal pillars with cushioned tips as claimed in claim 3, wherein the first metal is copper and the plurality of second metals is nickel.

5. Metal pillars with cushioned tips as claimed in claim 4, further comprises:
   gold, plated over the plurality of second metals.

6. Metal pillars with cushioned tips as claimed in claim 1, further comprises:
   a plurality of cavity pads, each of the plurality of cavity pads is comprised of a base metal configured to form a corresponding cavity;
   the plurality of cavity pads is configured on a top surface of a second electronic device; each of the cavity pads is adaptive for a corresponding metal pillar to insert, electrical coupling is obtained due to tight contact between the metal pillar, deformed metal sponge, and the cavity pad,
   wherein the metal sponge is deformed into the deformed metal sponge without thermal treatment.

7. Metal pillars with cushioned tips as claimed in claim 6, wherein cavities formed by the plurality of cavity pads have shapes, in a section view, of a polygon and a rectangle.

8. Metal pillars with cushioned tips as claimed in claim 6, wherein the metal pillar is deformed to form a bump and the bump is in tight contact with a corresponding cavity pad.

9. Metal pillars with cushioned tips as claimed in claim 8, further comprises:
   solder, configured on a top surface of the base metal of a corresponding cavity pad.

* * * * *